(12) United States Patent
Terhune, IV et al.

(10) Patent No.: US 7,658,633 B1
(45) Date of Patent: Feb. 9, 2010

(54) SOCKET HAVING CLIP WITH ATTACHING PORTION

(75) Inventors: Albert Harvey Terhune, IV, Chandler, AZ (US); Darrell Wertz, Chandler, AZ (US); David Gregory Howell, Gilber, AZ (US); Ming-Lun Szu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/288,664

(22) Filed: Oct. 22, 2008

(51) Int. Cl.
*H01R 13/62* (2006.01)
(52) U.S. Cl. .......................... 439/331; 439/73; 439/342
(58) Field of Classification Search ......... 439/330–331, 439/73, 342
See application file for complete search history.

(56) References Cited

U.S. PATENT DOCUMENTS

| | | | |
|---|---|---|---|
| 5,221,209 A * | 6/1993 | D'Amico | 439/71 |
| 6,183,285 B1 * | 2/2001 | Szu | 439/327 |
| 6,905,357 B2 | 6/2005 | Honhai | |
| 7,438,580 B1 * | 10/2008 | Aoki et al. | 439/331 |
| 7,566,237 B2 * | 7/2009 | Gattuso et al. | 439/331 |

* cited by examiner

*Primary Examiner*—Truc T Nguyen
(74) *Attorney, Agent, or Firm*—Andrew C. Cheng; Wei Te Chung; Ming Chieh Chang

(57) ABSTRACT

A socket adapted for electrically connecting an IC package and a PCB, comprising: a body mounted on the PCB for electrically connecting the IC package, two bolts mounted on the PCB and beside the body and a clip for retaining the IC package in the body. The bolt has a header portion on the top with biggest size, a middle portion and a screw portion engaging with the PCB. The clip has two attaching portions, each defining a hatch at a free end thereof, the clip links with the bolt by inserting the attaching portion toward the bolt to make the middle portion be received in the hatch and the header portion be upon the hatch to prevent the attaching portion from upward movement.

14 Claims, 4 Drawing Sheets

SOCKET HAVING CLIP WITH ATTACHING PORTION

BACKGROUND OF THE INVENTION

1. Field of the Invention

The present invention relates to a socket, especially to an LGA (Land Grid Array) socket mounted to a printed circuit board and adapted for electrically connecting a semiconductor package.

2. Description of the Related Art

U.S. Pat. No. 6,905,357, issued to Honhai on Jun. 14, 65 discloses a related LGA socket for electrically connecting an IC package to a printed circuit board. The socket includes a stiffener, an insulative housing located in the stiffener and fixed on the printed circuit board, a clip rotatablely assembling to an end of the stiffener to cover the insulative housing, and a load lever pivotally assembling to an opposed end of the stiffener. The insulative housing defines a plurality of passageways for receiving terminals therein. The stiffener defines a pair of slots, and the clip has two hooks inserting into the slot to pivotally assemble the clip to the stiffener.

Another related socket includes an housing having a number of terminals received therein. Two metal pieces are embedded and fastened to the housing, each metal piece defines a through hole at a top end thereof. A clip has two arched hooks inserting into the through holes of the metal pieces and pivotally assemble the clip to the metal piece, so that the clip can open or cover the socket body. However, both of above two related sockets assemble the clip by pivotally connecting to the stiffener or the metal piece, and each defines an open position and a close position related to the body. Operator need put the clip in the open position, then put the IC package in the socket, and finally rotate the clip to the close position and retain the clip. This operation process may need a certain time.

Hence, an improved socket is required to overcome the disadvantages of the prior art.

SUMMARY OF THE INVENTION

An object of the invention is to provide a socket with quick attachment.

To achieve the above-mentioned object, a socket adapted for electrically connecting an IC package, comprises a body formed with an insulative housing, at least one bolt mounted beside the body, and a clip. The bolt has a header portion on the top thereof, a middle portion and a screw portion. The clip has at least one attaching portion which defines a hatch, clip links with the bolt by inserting the attaching portion toward the bolt to make the middle portion be received in the hatch and the header portion be upon the hatch to prevent an upwardly movement of the clip.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
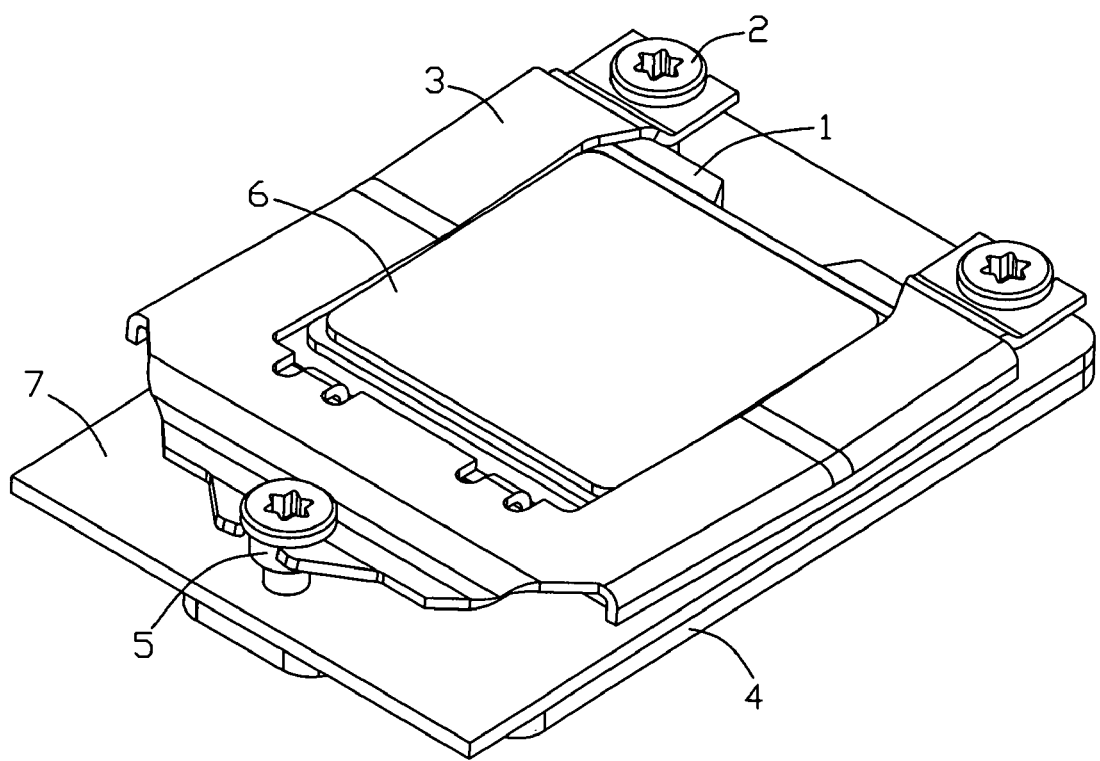
FIG. 1 is an assembled, perspective view of a socket in accordance with a preferred embodiment of present invention, wherein the socket receives an IC package and is mounted on a PCB.

Referring to FIG. 1, a socket in accordance with a preferred embodiment of present invention is disclosed for electrically connecting an IC package 6 to a PCB (printed circuit board) 7. The socket has a body 1 mounted to the PCB 7, two bolts 2 mounted to the PCB 7 and beside the body 1, a clip 3 linking to the bolt 2 for covering the body 1 and retaining the IC package 6 in the body 1, a backplane 4 mounted below the PCB 7, and a bolt 5 retaining the clip 3 to the PCB 7.

Figure 2:
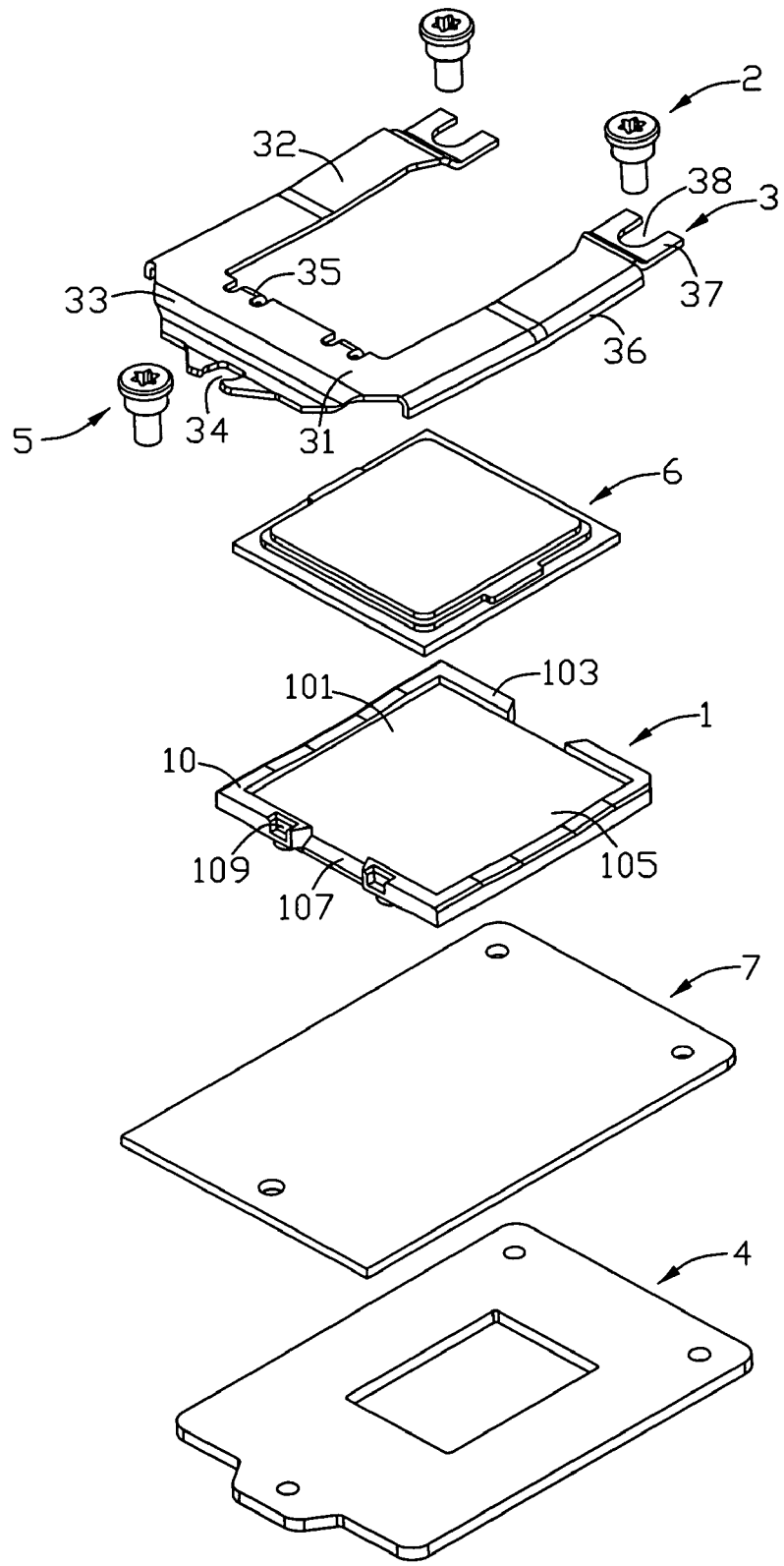
FIG. 2 is an exploded, perspective view of the socket shown in FIG. 1.

Referring to FIG. 2, the body 1 includes a rectangle insulative housing 10 and a plurality of terminals (not shown) received in the insulative housing 10 for electrically contacting with the IC package 6 and the PCB 7, respectively. The insulative housing 10 has a bottom wall 101 and four sidewalls 103 upwardly extending from a peripheral of the bottom wall 101, the bottom wall 101 and the sidewalls 103 together define a receiving space 105 for the IC package 6. Two opposed sidewalls 103 correspondingly define a pair of cutouts 107, and one of the opposed sidewall 103 further defines a pair of recesses 109 inwardly recessed from an out side surface of the sidewall 103 and located on two sides of the cutout 107. Another two sidewalls 103 have substantially downwardly arc top surfaces.

The clip 3 is stamped from metal piece and in a U-shape. The clip 3 has a front edge 31 and two lateral edges 32 extending from the front edge 31. The front edge 31 has a tongue 33 forwardly extending and defining a retaining gap 34. The front edge 31 further has two parcels 35 downwardly bent from an inner side of the front edge 31 opposite to the tongue 33. Each of the lateral edge 32 has a side piece 36 downwardly extending to cover corresponding sidewall 103 of the insulative housing 10. Each lateral edge 32 further has an attaching portion 37 on a free end by which the clip 3 links to the bolts 2. The attaching portion 37 is fork-shaped and defines a U-shaped hatch 38 at a free end thereof and in a center thereof.

Figure 3:
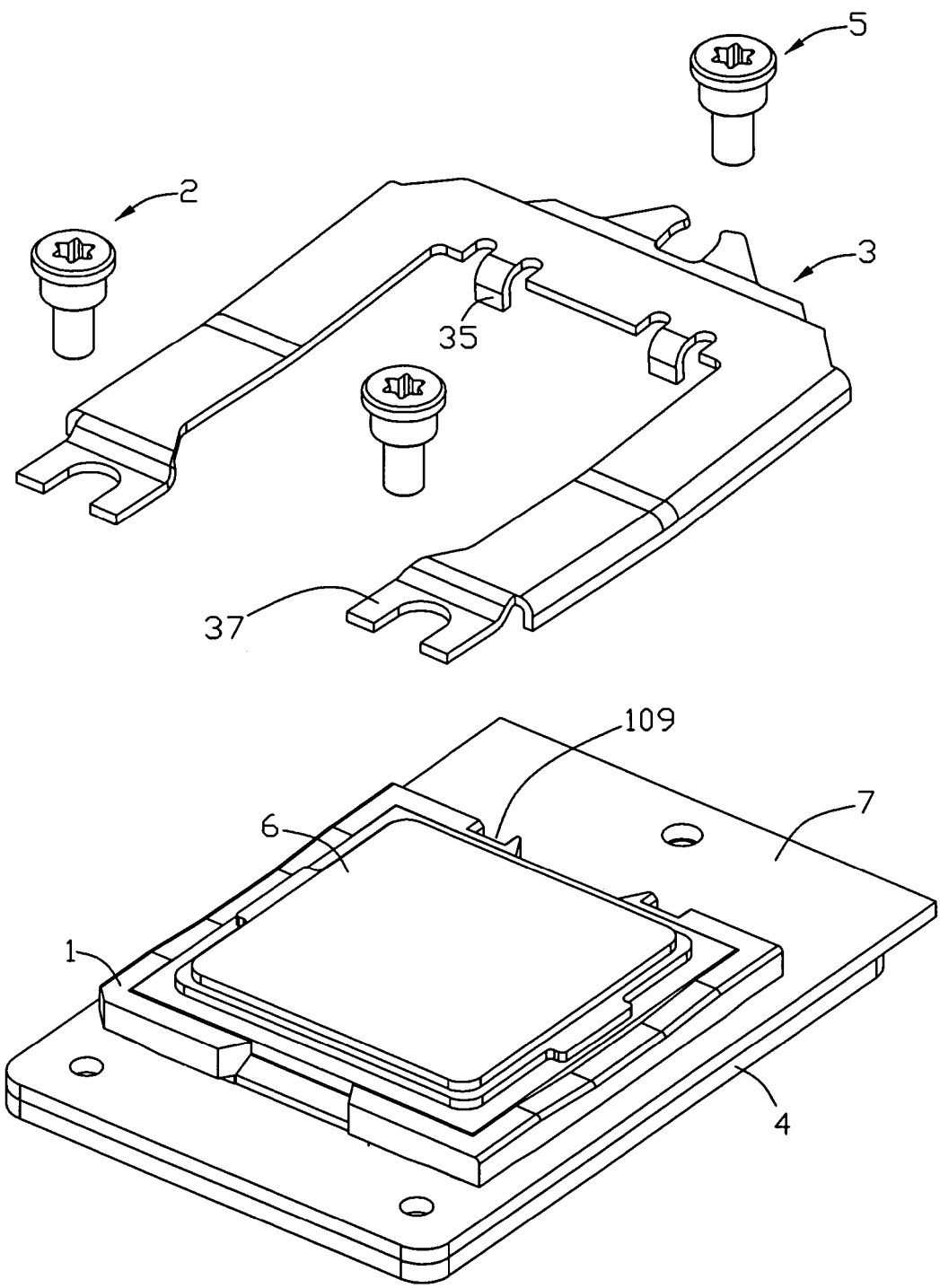
FIG. 3 is a partially assembled, perspective view of the socket shown in FIG. 1.
Figure 4:
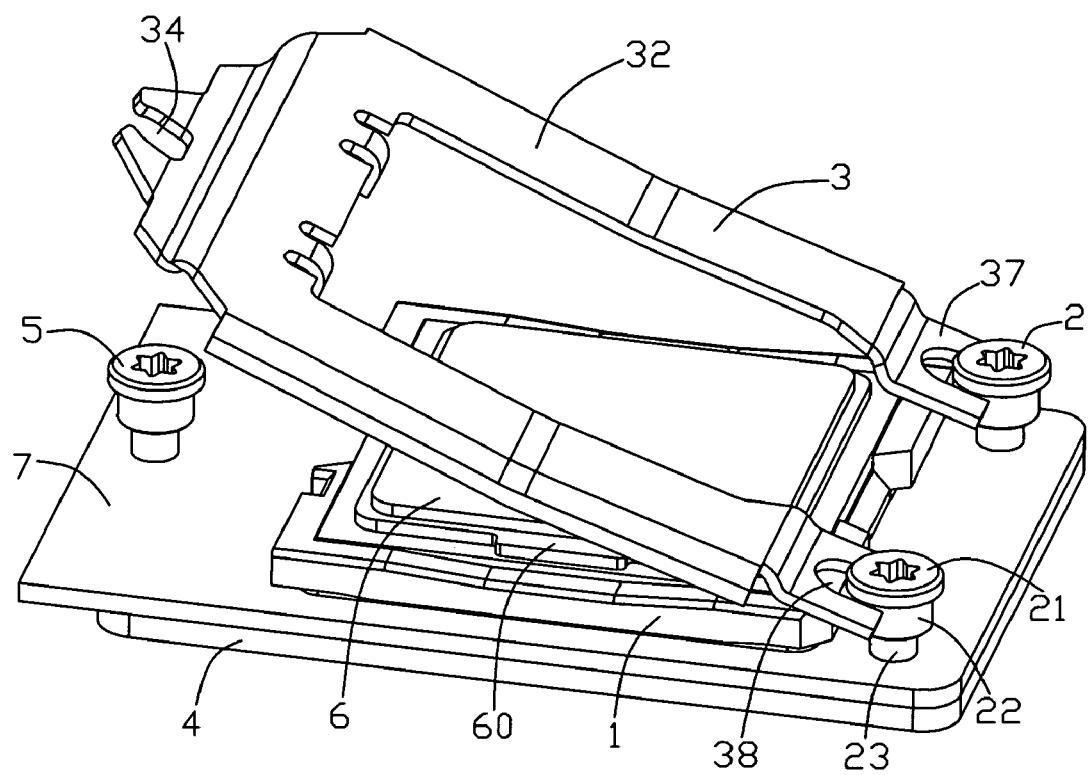
FIG. 4 is similar with FIG. 3, showing a clip assembling to two bolts.

Referring to FIGS. 3-4, the bolts 2 are mounted on the PCB 7 and beside body 1. The bolt 2 is a cylinder configure with three steps: a header 21 on the top with biggest radius, a middle portion 22 and a screw 23 with smallest radius. A width of the hatch 38 of the clip 3 is approximate equal with a radius of the middle portion 22 but narrower than that of the header portion 21.

The clip 3 links to the bolt 2 by inserting the attaching portion 37 toward the bolt 2 to make the middle portion 22 be received in the hatch 38 and the header portion 21 be upon the hatch 38 to prevent an upwardly movement of the clip 3. Simultaneity, the clip 3 may downwardly move toward the body 1, so that the clip 3 can further insert toward the bolt 2 and synchronously cover the body 1. Finally, the bolt 5 passes through the retaining gap 34 of the clip 3 and mounts to the PCB 7 to retain the clip 3. The bolts 2, 5 also assemble the backplane 4 on a bottom surface of the PCB 7. When the clip 3 covers the body 1, the parcels 35 of the clip 3 engage with the recesses 109 of the body 1. Furthermore, the IC package 6 has a pressing portion 60 pressed by the lateral edge 32 of the clip 3. The clip 3 of the socket in accordance with present invention can be easily and quickly attached to the bolts 2, that can simply an assembly process of the socket.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An integrated circuit socket adapted for electrically connecting an integrated circuit package, comprising:
    a body formed with an insulative housing;
    at least one bolt mounted beside the body and having a header portion on the top thereof, a middle portion and a screw portion; and
    a clip having at least one attaching portion which defines a U-shaped notch, the clip linking with the bolt by slidably inserting the attaching portion toward the bolt to make the middle portion be received in the U-shaped notch in such a way that the header portion be upon the U-shaped notch to prevent an upwardly movement of the clip;
    wherein the clip is in U-shaped and having a front edge and two lateral edges extending from the front edge, the at least one attaching portion is two attaching portions each extending from a free end of the lateral edge, respectively;
    wherein the front edge of the clip has a tongue forwardly extending and defining a retaining gap for another bolt passing through to retain the clip.

2. An integrated circuit socket as described in claim 1, wherein the body has a plurality of terminals received in the body, the insulative housing defines a receiving space for receiving the integrated circuit package.

3. An integrated circuit socket as described in claim 1, wherein the front edge further has two parcels downwardly bent from an inner side of the front edge, the insulative housing defines two recesses for engaging with the parcels of the clip.

4. An integrated circuit socket adapted for electrically connecting an integrated circuit package to a printed circuit board, comprising:
    a body mounted on the printed circuit board for electrically connecting the integrated circuit package;
    two bolts mounted on the printed circuit board and beside the body; and
    a clip for covering the body and having two attaching portions extending from a front edge portion and forms into a U-shaped clip, the attaching portions linking with the bolts after the bolts are mounted on the printed circuit board, the clip being retained by the bolt in an upward direction;
    wherein each attaching portion of the clip defines a U-shaped notch, each bolt has a header portion on the top with biggest size, a middle portion and a screw portion, the clip links with the bolt by slidably inserting the attaching portion toward the bolt to make the middle portion be received in the hatch U-shaped notch the header portion can prevent the attaching portion from upwardly movement;
    wherein the front edge portion of the clip has a tongue forwardly extending and defining a retaining gap for another bolt passing through to retain the clip.

5. An integrated circuit socket as described in claim 4, wherein the front edge has a tongue forwardly extending and defining a retaining gap for another bolt passing through to retain the clip to the printed circuit board.

6. An integrated circuit socket as described in claim 4, wherein the front edge further has two parcels downwardly bent from an inner side of the front edge, the body defines two recesses for engaging with the parcels of the clip.

7. An integrated circuit socket as described in claim 4, wherein the body has an insulative housing and a plurality of terminals received in the insulative housing, the insulative housing defines a receiving space for receiving the integrated circuit package.

8. An integrated circuit socket assembly for use with an integrated circuit package, comprising:
    a printed circuit board defining a mounting face;
    an insulative housing mounted upon the mounting face and defining an upward facing recess in an upper face thereof;
    at least one first fastening pole with a large head, mounted upon the mounting face and spaced from a first edge of said socket;
    a U-shaped metallic clip having two attaching portions extending from a front edge portion mounted upon the housing and defining a fork type attachment portion at an end of each of the attaching portions, the fork type attachment portion having an outward opening to laterally receive the first fastening pole therein while being under the corresponding large head under a condition that the first fastening pole is allowed not to be removed from the printed circuit board during assembling the clip thereto in a rotative way;
    wherein the front edge portion of the U-shaped metallic clip has a tongue forwardly extending and defining a retaining gap for another fastening pole passing through to retain the U-shaped metallic clip.

9. The socket assembly as claimed in claim 8, further including a second fastening pole with a large head, mounted upon the mounting face and spaced from a second edge of the socket which is far away and opposite to the first edge; wherein said clip further defines an attachment section locked by said second fastening pole.

10. The socket assembly as claimed in claim 9, wherein said attachment section is similar to said fork type attachment portion.

11. The socket assembly as claimed in claim 9, wherein there are two said first attachment portions while only one said second attachment section.

12. The socket assembly as claimed in claim 9, wherein said attachment section is required to be removed from the printed circuit board during assembling said clip thereto.

13. The socket assembly as claimed in claim 8, wherein complementary interengaging devices are formed on the housing and clip around a second edge far away and opposite to the first edge.

14. The socket assembly as claimed in claim 8, wherein complementary interengaging devices are formed on the housing and clip around said second edge.

* * * * *